(12) United States Patent
d'Abreu

(10) Patent No.: US 9,659,882 B2
(45) Date of Patent: May 23, 2017

(54) SYSTEM, METHOD AND APPARATUS TO RELIEVE STRESSES IN A SEMICONDUCTOR DIE CAUSED BY UNEVEN INTERNAL METALLIZATION LAYERS

(71) Applicant: SanDisk Technologies LLC, Plano, TX (US)

(72) Inventor: Manuel A. d'Abreu, El Dorado Hills, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 14/600,316

(22) Filed: Jan. 20, 2015

(65) Prior Publication Data
US 2016/0211223 A1  Jul. 21, 2016

(51) Int. Cl.
*H01L 23/34* (2006.01)
*H01L 21/311* (2006.01)
*H01L 23/00* (2006.01)
*H01L 23/538* (2006.01)
*H01L 25/065* (2006.01)
*H01L 21/768* (2006.01)
(Continued)

(52) U.S. Cl.
CPC .......... *H01L 23/562* (2013.01); *H01L 21/302* (2013.01); *H01L 21/768* (2013.01);
(Continued)

(58) Field of Classification Search
CPC .............. H01L 21/563; H01L 21/67236; H01L 23/3114; H01L 23/4951; H01L 23/538; H01L 23/5389; H01L 24/01; H01L 24/10; H01L 24/18; H01L 24/82; H01L 2021/60022; H01L 2224/01; H01L 2224/08135; H01L 2224/32135; H01L 2224/82
USPC ....... 257/712, 774, 690, 147, 676, 741, 737, 257/751, 506, 531, 739, 777, 776, 704, 257/781, 678, 773; 438/700, 460, 119, 438/464
See application file for complete search history.

(56) References Cited

U.S. PATENT DOCUMENTS 7,276,435 B1 * 10/2007 Pozder .............. H01L 21/76838
  438/597
7,701,070 B1 * 4/2010 Li ........................ H01L 23/528
  257/781

(Continued)

OTHER PUBLICATIONS

ISR PCT/US2015/061493, dated Mar. 14, 2016, 2 pages.

*Primary Examiner* — Julio J Maldonado
*Assistant Examiner* — Moin Rahman
(74) *Attorney, Agent, or Firm* — Stoel Rives LLP

(57) ABSTRACT

A system, method and apparatus for making a semiconductor die includes forming multiple semiconductor devices in a respective portion of a semiconductor wafer. An electrical interconnect structure is formed over the semiconductor devices and provide electrical connections to the semiconductor devices. The electrical interconnect structure including one or more metallization layers. Each of the metallization layers includes conductive lines. At least one portion of at least one of the metallization layers includes a density of the conductive lines that varies as compared to the other portions of the metallization layers. At least one support structure is formed in the electrical interconnect structure. The semiconductor wafer can be a thinned semiconductor wafer.

18 Claims, 10 Drawing Sheets

(51) Int. Cl.
*H01L 21/302* (2006.01)
*H01L 21/82* (2006.01)
*H01L 25/18* (2006.01)
*H01L 25/00* (2006.01)

(52) U.S. Cl.
CPC .......... *H01L 21/82* (2013.01); *H01L 23/5386* (2013.01); *H01L 23/5389* (2013.01); *H01L 24/00* (2013.01); *H01L 25/0652* (2013.01); *H01L 25/0655* (2013.01); *H01L 25/0657* (2013.01); *H01L 25/18* (2013.01); *H01L 25/50* (2013.01)

(56) References Cited

U.S. PATENT DOCUMENTS

| | | | |
|---|---|---|---|
| 2006/0154469 A1* | 7/2006 | Hess | H01L 23/522 438/618 |
| 2007/0275539 A1* | 11/2007 | Rashid | G01R 31/2884 438/460 |
| 2008/0179734 A1 | 7/2008 | Kwon et al. | |
| 2008/0308946 A1* | 12/2008 | Pratt | H01L 21/563 257/777 |
| 2010/0308442 A1 | 12/2010 | Naka et al. | |
| 2011/0175225 A1* | 7/2011 | Seddon | H01L 21/76898 257/750 |
| 2011/0291285 A1* | 12/2011 | Ueberreiter | H01L 23/528 257/773 |
| 2012/0319248 A1* | 12/2012 | Rahman | H01L 23/147 257/621 |
| 2013/0015482 A1 | 1/2013 | Su | |
| 2015/0371938 A1* | 12/2015 | Katkar | H01L 25/50 257/774 |

\* cited by examiner

SYSTEM, METHOD AND APPARATUS TO RELIEVE STRESSES IN A SEMICONDUCTOR DIE CAUSED BY UNEVEN INTERNAL METALLIZATION LAYERS

BACKGROUND

The present invention relates generally to semiconductor dies, and more particularly, to systems, methods and apparatus for forming stress relieving structures in the semiconductor die.

Semiconductor device sizes are constantly being pushed ever smaller physical size to provide lower power consumption and faster operation. The smaller devices are then packed in ever increasing densities on a semiconductor die. Conductive lines to each of the devices are typically formed in multiple metal layers such as copper or copper alloy metal layers. The density of the conductive lines in the metallization layer(s) increase to correspond to the increase in semiconductor device density.

The density of the conductive lines and conducting devices in the metallization layers is corresponds to a volume of metal as compared to the volume of insulating material in the metallization layer. As the number of conductive lines and conducting devices in a metallization layer increases, the volume of insulating material in the metallization layer decreases.

Increases and decreases in temperature of the semiconductor dies during operation cause the metallization layers to expand and contract, respectively, at rates greater than the surrounding semiconductor materials such as silicon and insulators such as silicon dioxide and other oxide layers insulating adjacent metal layers. The increases in density of the conductive lines and conducting devices in the metallization layers can also increase physical stresses in the semiconductor structure. These physical stresses can cause the semiconductor die to warp and bend and cause layers within the semiconductor die to delaminate and/or form voids that damage the semiconductor devices. The physical stresses reduce the reliability of the semiconductor devices.

In some instances the semiconductor wafer is thinned for various reasons. Thinning the semiconductor substrate can result in flexing, warping and delamination and the resulting semiconductor device damage as described above. Thinning the semiconductor substrate reduces the strength of the semiconductor wafer and thus reduces the ability of the semiconductor wafer to resist the flexing, warping and delamination stresses. The disclosed embodiments can relieve at least a portion of the physical stresses caused by variations in density of the conductive lines and conducting devices in the metallization layers.

SUMMARY

Broadly speaking, the present invention fills these needs by providing a system, method and apparatus for relieving physical stresses caused by variations in density of the conductive lines and conducting devices in the metallization layers in the semiconductor die. It should be appreciated that the present invention can be implemented in numerous ways, including as a process, an apparatus, a system, computer readable media, or a device. Several inventive embodiments of the present invention are described below.

One embodiment provides a semiconductor die that includes multiple semiconductor devices formed in respective portions of a semiconductor wafer. An electrical interconnect structure is formed over the semiconductor devices and provide electrical connections to the semiconductor devices. The electrical interconnect structure includes one or more metallization layers. Each of the metallization layers includes conductive lines. At least one portion of at least one of the metallization layers includes a density of the conductive lines that varies as compared to the other portions of the metallization layers. At least one support structure is formed in the electrical interconnect structure The respective portion of the semiconductor wafer has a thickness of between about 700 nm and about 900 nm. The respective portion of a semiconductor wafer can be thinned after the semiconductor devices are formed. The thinned wafer can have a thickness of between about 40 um and about 200 um.

The least one support structure is formed in one or more layers of the electrical interconnect structure. When the support structure is formed in at least two layers of the electrical interconnect structure an anchor structure can be formed through any intervening layers between the at least two layers to connect the portions of the support structure. The support structure can have different respective widths in each of the at least two layers.

The support structure can be formed in a metal used to form the electrical interconnects in the electrical interconnect structure. The support structure may or may not be a portion of the electrical interconnects. The support structure may or may not be a portion of an electrical device such as a capacitor or an inductor formed in the electrical interconnects.

The support structure can be a portion of a wafer support structure that substantially extends across a width of the semiconductor wafer. The semiconductor die can be stacked with multiple similar semiconductor dies and included in a predefined form factor package such as a memory card package. The form factor package can include connect structures coupling the stacked semiconductor dies to a contact pad structure.

The semiconductor devices formed in the semiconductor wafer can include memory cells and/or 3D memory cells. The semiconductor devices can form a processor.

Another embodiment provides a semiconductor die including multiple semiconductor devices formed in a portion of a semiconductor wafer. An electrical interconnect structure is formed over the semiconductor devices and provides electrical connections to the semiconductor devices. The electrical interconnect structure defined from multiple metallization layers. Each of the metallization layers including conductive lines. At least one portion of at least one of the metallization layers includes a density of the conductive lines that varies as compared to the other portions of the metallization layers. A first support structure is formed in a first one of the metallization layers, the first support structure having a first width. A second support structure is formed in a second one of the metallization layers, the second support structure having a second width different than the first width. An anchor structure is formed through any layers intervening between the first metallization layer and the second metallization layer.

The at least one support structure is formed of a conductive metal used to form the electrical interconnects in the electrical interconnect structure. In one or more embodiments, the least one support structure may or may not be a portion of one of the electrical interconnects. The first support structure can have a first length corresponding to a length of the semiconductor die.

Another embodiment provides a memory card package including multiple semiconductor dies in a stacked configuration. At least one of the semiconductor dies includes multiple semiconductor devices formed in a portion of a semiconductor wafer. The semiconductor wafer having a thickness of between about 40 um and about 200 um. An electrical interconnect structure is formed over the semiconductor devices and provides electrical connections to the semiconductor devices. The electrical interconnect structure defined from multiple metallization layers, each of the metallization layers including conductive lines. At least one portion of at least one of the metallization layers includes a density of the conductive lines that varies as compared to the other portions of the metallization layers. At least one support structure is formed in the electrical interconnect structure of at least one of the semiconductor dies. The memory card package can include a predefined form factor package including a predefined thickness, wherein the stacked configuration of the semiconductor dies has a thickness less than the predefined thickness.

Yet another embodiment provides a method of forming a thinned semiconductor die. Multiple semiconductor devices are formed in a semiconductor wafer. An electrical interconnect structure is formed over the semiconductor devices. The electrical interconnect structure being electrically coupled to the semiconductor devices. The electrical interconnect structure defined from multiple metallization layers, each of the metallization layers including conductive lines. At least one portion of at least one of the metallization layers includes a density of the conductive lines that varies as compared to the other portions of the metallization layers. At least one support structure is formed in the electrical interconnect structure. The semiconductor wafer is thinned to between about 40 um and about 200 um. The thinned semiconductor wafer can them be separated (e.g., diced) into multiple, thinned semiconductor dies.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for systems, methods and apparatus for relieving physical stresses caused by variations in density of the conductive lines and conducting devices in the metallization layers in the semiconductor die will now be described. It will be apparent to those skilled in the art that the present invention may be practiced without some or all of the specific details set forth herein.

The standardization of the computer industry has produced several standardized shapes, sizes and electrical connection form factors. One common example memory device is referred to as a Secure Digital card or more generically, as an SD card. More compact versions of the SD card are referred to as the SD mini card and SD micro card. There are several other standardized memory form factors similar to the SD card often referred to generically as memory sticks and memory cards. As used hereafter, the term memory card refers to any commercially available completed memory card assembly.

Increasing the number of memory cells in each of the standardized form factors is a constant growth direction for the memory card industry. Higher densities of semiconductor devices are formed on each semiconductor die to increase the number of memory cells per square millimeter. Other applications of memory also require higher memory cell densities. By way of example, solid state drives (SSDs) also seek higher memory cell densities.

Figure 1:
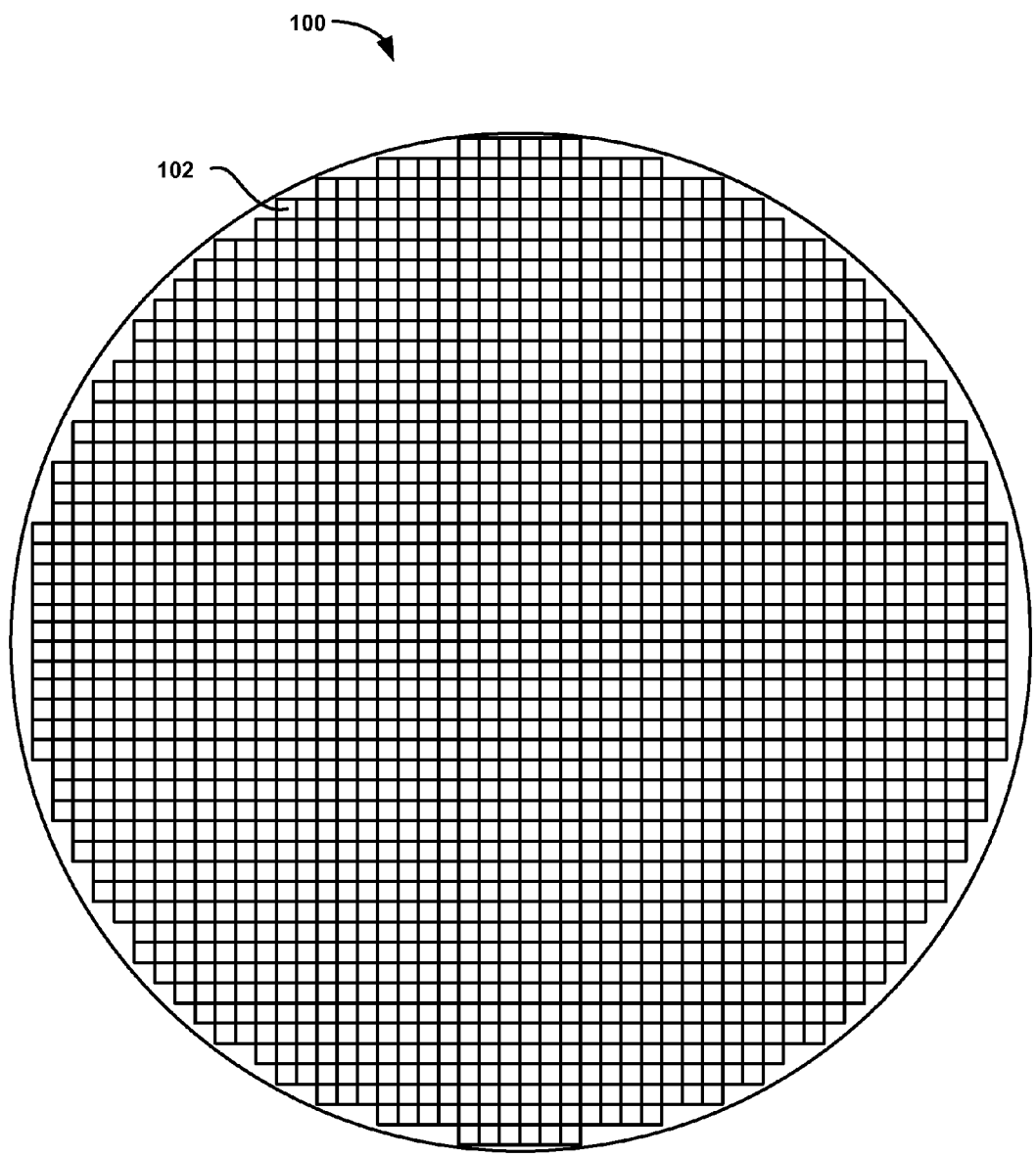
FIG. 1 is a simplified schematic diagram of a semiconductor wafer with multiple, high density, memory dies formed thereon, for implementing embodiments of the present disclosure.

FIG. 1 is a simplified schematic diagram of a semiconductor wafer 100 with multiple, high density, memory dies 102 formed thereon, for implementing embodiments of the present disclosure. The multiple, high density, memory dies 102 are formed simultaneously on the semiconductor wafer 100. The semiconductor wafer 100 is cut to separate each of the memory dies 102.

Figure 2A:
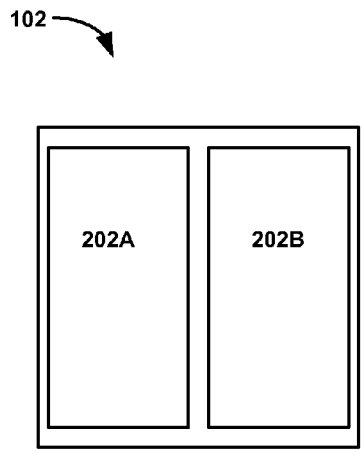
FIG. 2A is a simplified schematic diagram of a high density, memory die, for implementing embodiments of the present disclosure.

FIG. 2A is a simplified schematic diagram of a high density, memory die 102, for implementing embodiments of the present disclosure. The high density, memory die 102 has two planes 202A, 202B. Each of the planes 202A, 202B can have a different density of the conductive lines and conducting devices in the metallization layers of the metal interconnect structures formed thereon. The conductive lines and conducting devices in the metallization layers of the metal interconnect structures can be formed in one or more layers separated by an electrically insulating layer. The conductive lines and conducting devices can also include electrical devices such as capacitors, inductors etc.

Figure 2B:
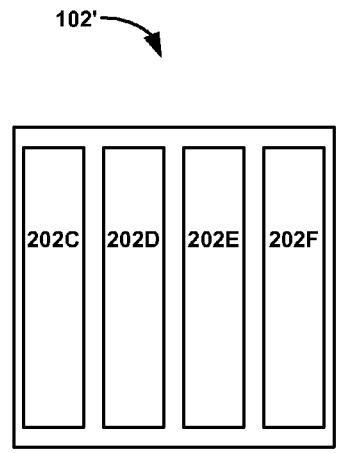
FIG. 2B is a simplified schematic diagram of a high density, memory die, for implementing embodiments of the present disclosure.

FIG. 2B is a simplified schematic diagram of a high density, memory die 102', for implementing embodiments of the present disclosure. The high density, memory die 102' has four planes 202C-F. Each of the planes 202C-F can have a different density of the conductive lines and conducting devices in the metallization layers.

The differing densities of the conductive lines and conducting devices in the metallization layers in the planes 202A-F cause stresses to the respective memory dies 102, 102' that reduce the yield and the reliability of the memory dies. It should be noted that while two and four planes of differing densities of the conductive lines and conducting devices in the metallization layers are described in FIGS. 2A and 2B, that more or less than two or four planes of differing densities of the conductive lines and conducting devices can be included in each memory die 102. By way of example, each memory die 102, 102' can include one, three, five, eight, eleven, or sixteen or more planes.

Figure 2C:
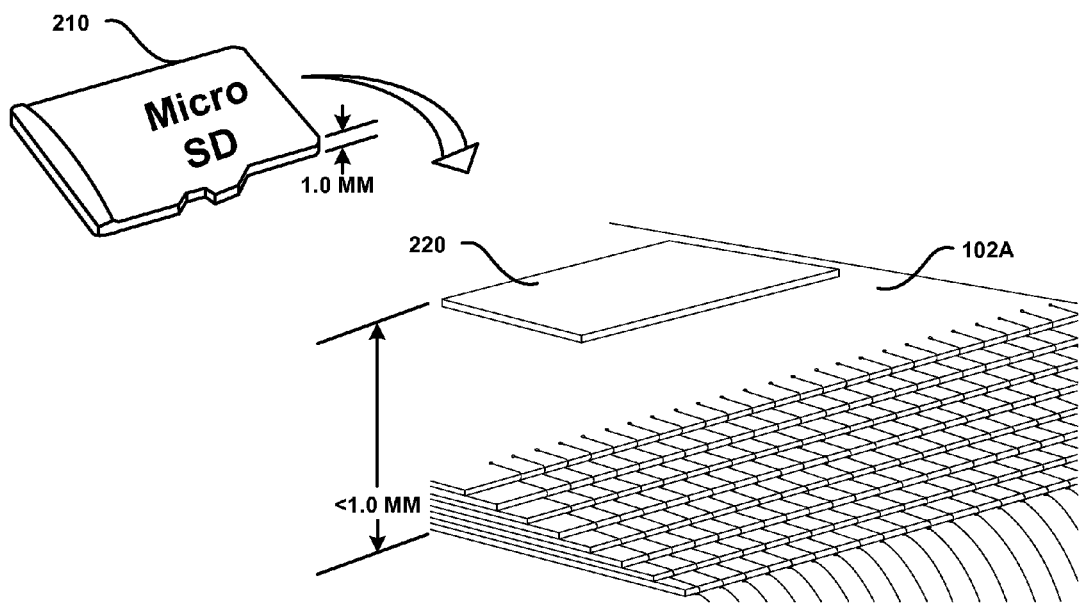
FIG. 2C is a simplified schematic diagram of a micro SD memory card form factor, for implementing embodiments of the present disclosure.

To further increase memory device density per square millimeter of area in a single, standardized form factor of the memory card, multiple dies 102 can be stacked and packaged in the memory card or solid state drive. However, when the memory card has a standardized form factor, the stacked die package can have a maximum thickness allowed by the standardized form factor. FIG. 2C is a simplified schematic diagram of a micro SD memory card form factor 210, for implementing embodiments of the present disclosure. Multiple, thinned, stacked dies 102A are included in the micro SD memory card form factor 210. The memory card form factor 210 can also include a processor 220. The memory card form factor 210 limits the thickness of the thinned, stacked dies 102A and the processor 220 to a total thickness of less than about 1.0 mm. It should be noted that the micro SD card is merely an example memory card used for purposes of describing the disclosed embodiments and any memory card, solid state drive or other form factor or application can use the stacked memory dies to increase the memory cell density.

The processor 220 can have a higher density of devices than the stacked dies 102A. Further, the processor 220 can be significant heat source. The heat from the processor 220 is at least in part, dissipated unevenly into the thinned, stacked dies 102A as the processor is smaller in outline than the thinned, stacked dies 102A. The uneven heating by the processor 220 can also increase the physical stresses in the thinned, stacked dies 102A.

Figure 3A:
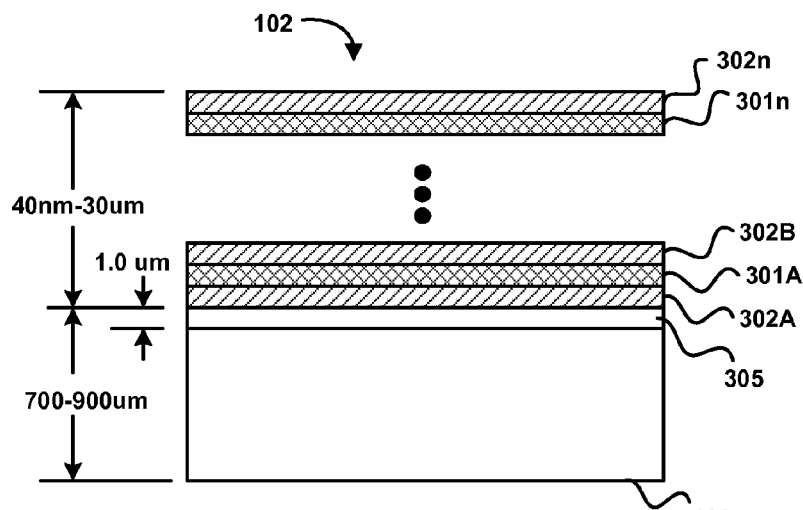
FIG. 3A is a sectional view of a die cut from a semiconductor wafer, for implementing embodiments of the present disclosure.

One approach to making the thinned dies 102A is to thin the semiconductor wafer 100 thickness before the semiconductor wafer is separated (e.g., diced) into pieces to form the thinned dies 102A. FIG. 3A is a sectional view of a die 102 cut from a semiconductor wafer 100, for implementing embodiments of the present disclosure. The semiconductor wafer 100 typically has a thickness of about 700 um to about 900 um. The semiconductor devices 305 are formed in less than about a top 1.0 um of the semiconductor wafer 100. The semiconductor devices 305 can include transistors, capacitors, memory cells, 3D memory cells, logic gates, drivers, etc. as may be desired for the desired operation of the die 102. The remaining 749 um of the 750 um thickness of the semiconductor wafer 100 provides physical, structural support for the resulting dies 102.

Electrical interconnect structure is formed in multiple metal and/or metal alloy metallization layers 301A-n and electrically insulating layers 302A-n formed on the top surface of the semiconductor wafer 100. The electrical interconnect structure containing layers 301A-n, 302A-n, have a total thickness of between about 40 nm and about 500 nm. In one implementation, one or more of the layers in the electrical interconnect structure can be between about 6 nm and about 30 um. It should be noted that the semiconductor wafer 100 and the electrical interconnect structure layers 301A-n, 302A-n, are not drawn to scale and that each of the electrical interconnect structure layers can have a different thickness than the other electrical interconnect structure layers. The top most layer of the electrical interconnect structure 301A-n, 302A-n can be a conductive metal layer or an insulating layer and/or other passivated layer(s) to protect the top surface of the electrical interconnect structure.

Figure 3B:
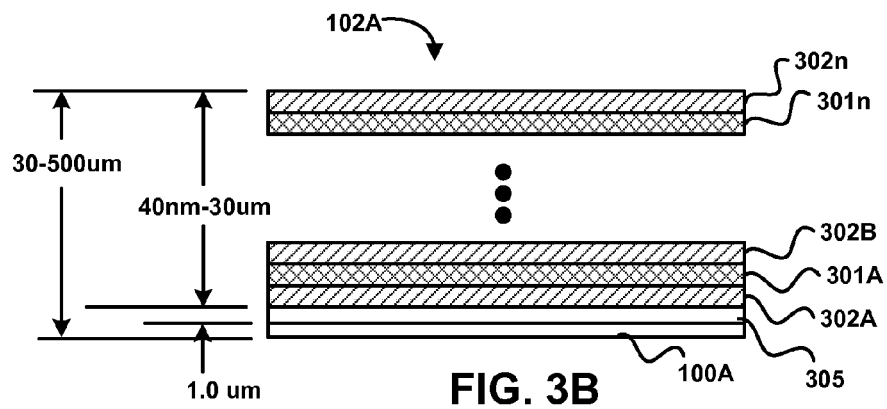
FIG. 3B is a sectional view of a thinned die, for implementing embodiments of the present disclosure.

FIG. 3B is a sectional view of a thinned die 102A, for implementing embodiments of the present disclosure. The thinned die 102A has a total thickness of between about 30 um and about 500 um. The semiconductor wafer 100 is thinned by removing about 500 um to about 870 um of the thickness of the semiconductor wafer. The resulting thinned semiconductor wafer 100A can be thinned before the dicing process to separate the thinned dies 102A. The semiconductor wafer 100 can be thinned by any suitable means such as chemical mechanical planarizing (CMP), chemical etching, plasma etching, grinding, shaving, cutting and combinations thereof.

Figure 3C:
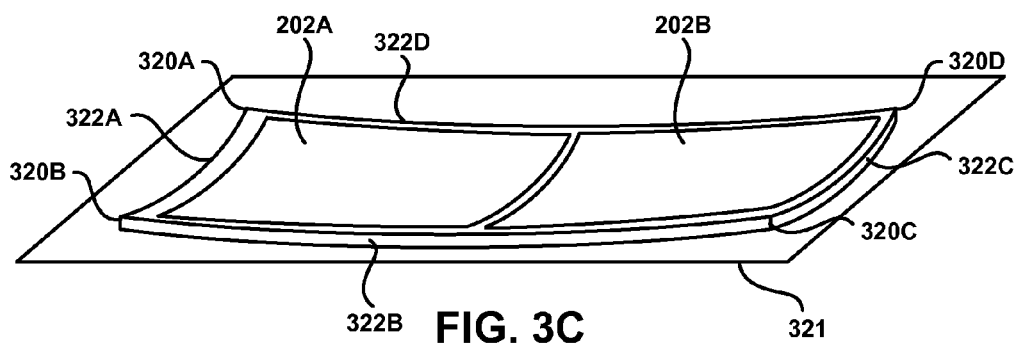
FIG. 3C is a simplified perspective view of a thinned die, for implementing embodiments of the present disclosure.

FIG. 3C is a simplified perspective view of a thinned die 102A, for implementing embodiments of the present disclosure. The thinned die 102A is shown resting on a flat reference plane 321. The thinned semiconductor wafer 100A removes most of the physical, structural support of the thinned die 102A. The combination of reduced physical, structural support and the variations in density of the conductive lines and conducting devices in the metallization layers in the metal interconnect structures in the planes 202AB, can cause the thinned die 102A to curl, twist and bend such that the corners 320A-D pull upward, away from the reference plane 321, as shown, or alternatively push down toward the reference plane (not shown). The sides 322A-D of the thinned die 102A can curve in a concave direction, as shown, or a convex direction or rippled with portions of the planes 202AB curved in both convex and concave bends. The various curvatures of the thinned die 102A cause physical shearing, pulling and delaminating stresses to the metallization layers and the semiconductor devices.

Further, variation in temperatures during operation can cause the metallization layers to expand and contract at rates greater than the thinned semiconductor wafer 100'. This difference in thermal expansion rates can cause additional stresses to the metallization layers and the semiconductor devices.

Figure 3D:
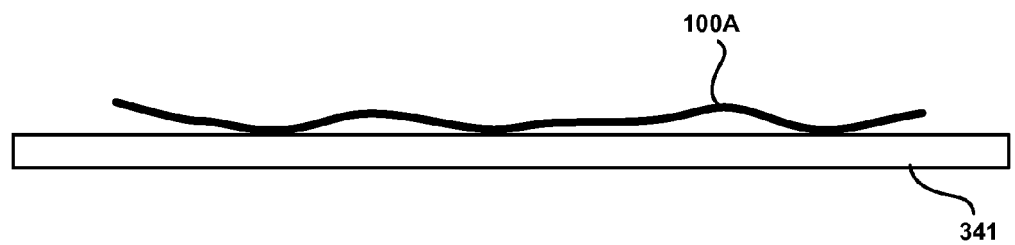
FIG. 3D is a side view of a thinned semiconductor wafer, for implementing embodiments of the present disclosure.

FIG. 3D is a side view of a thinned semiconductor wafer 100A, for implementing embodiments of the present disclosure. The thinned semiconductor wafer 100A is shown resting on a flat reference plane 341. The variations in densities of the conductive lines and conducting devices in the metallization layers formed across the surface of the thinned semiconductor wafer 100A can cause the thinned semiconductor wafer to curve, bend, warp and twist away from the reference plane 341. It should be noted that the curving, bending, warping and twisting of the thinned semiconductor wafer 100A is not drawn to scale. Special handling tooling such as vacuum chucks and other tools are required to hold and support the thinned semiconductor wafer 100A in a substantially flat position during subsequent operations such as cleaning, rinsing, dicing, etc. to prevent stress related damage to the semiconductor devices and the metallization layers.

Figure 4:
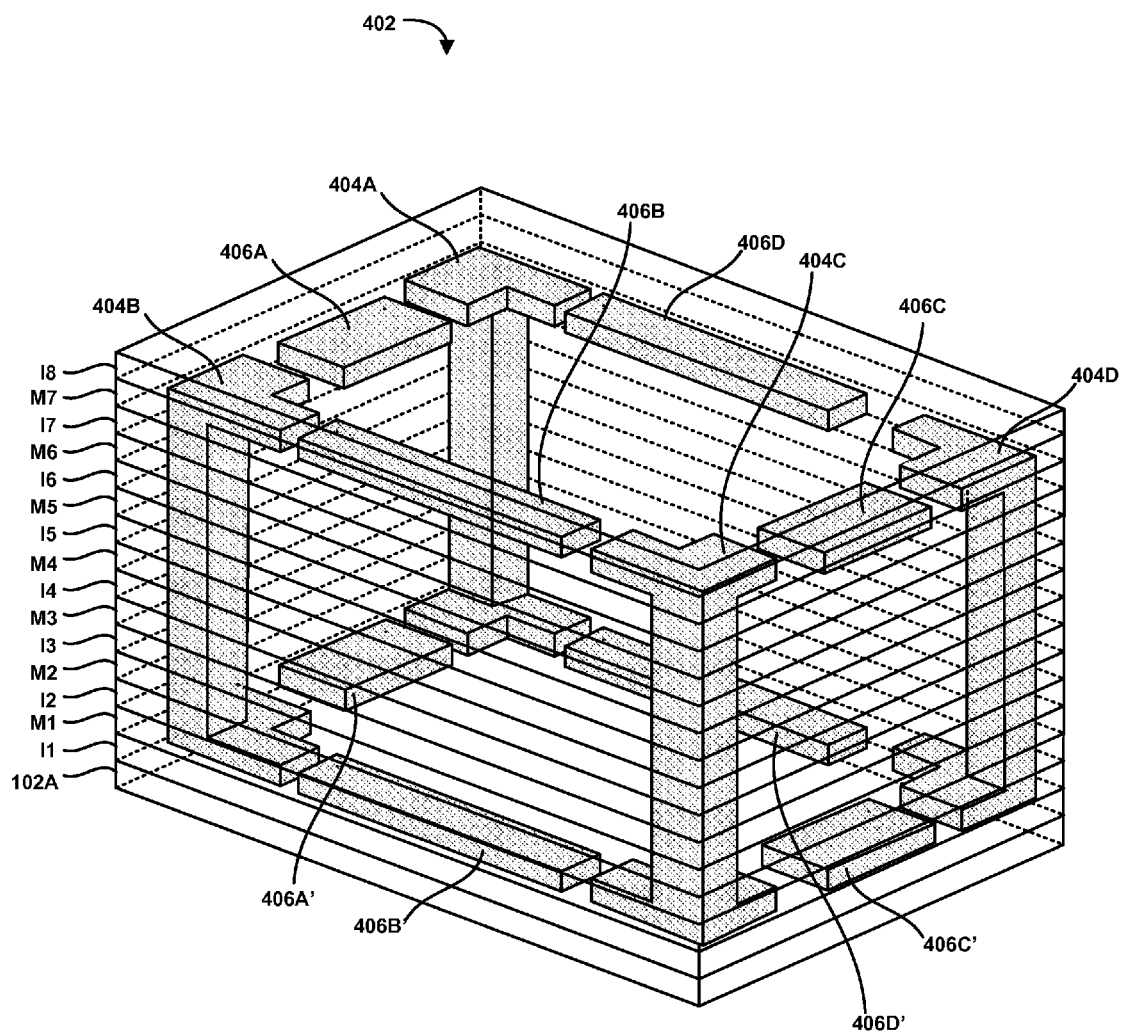
FIG. 4 is an isometric view of a thinned die with added anchor structures and support structures, for implementing embodiments of the present disclosure.
Figure 5A:
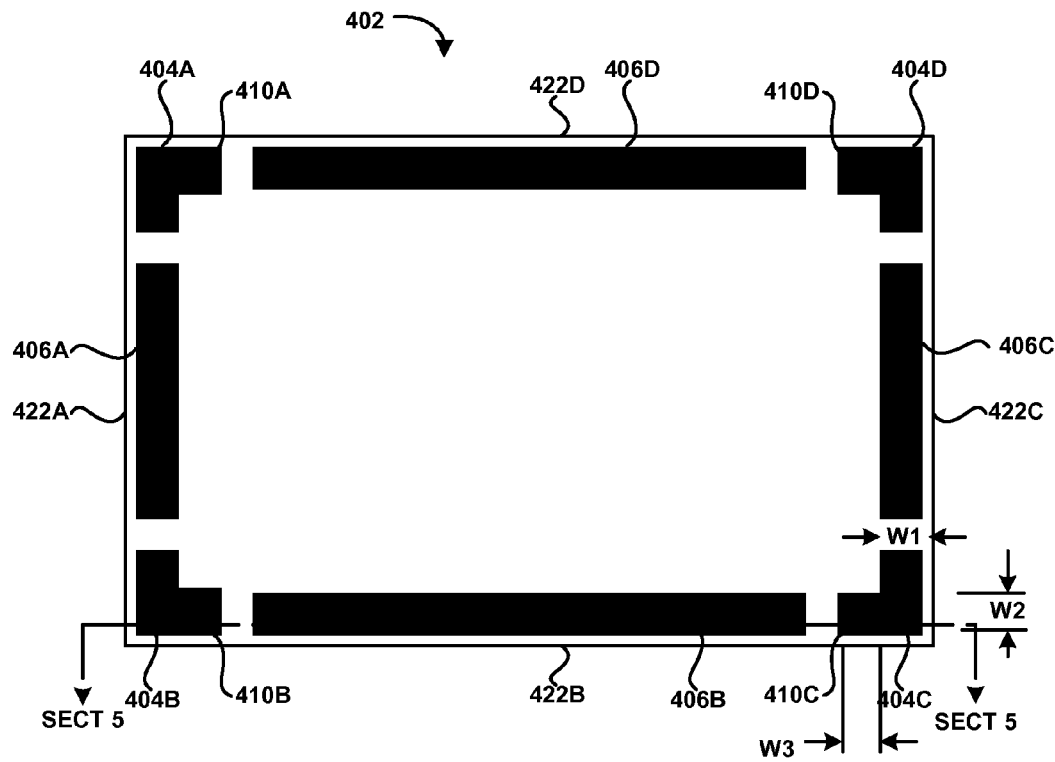
FIG. 5A is a top view of a thinned die with added anchor structures and support structures, for implementing embodiments of the present disclosure.
Figure 5B:
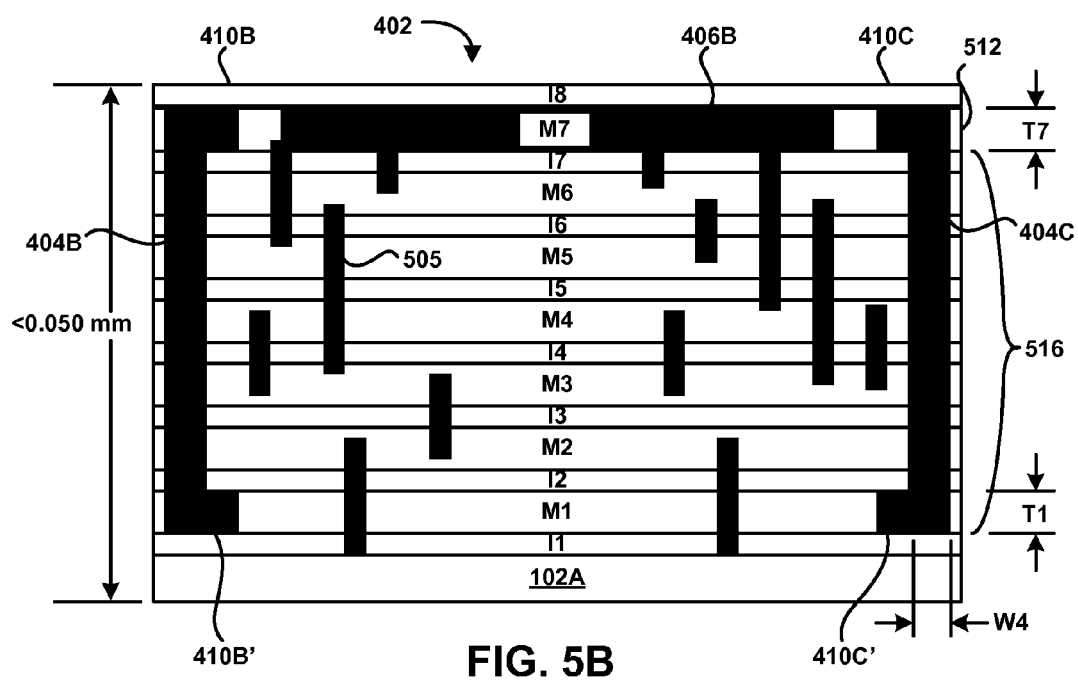
FIG. 5B is a sectional view of the thinned die with added anchor structures and support structures, for implementing embodiments of the present disclosure.

FIG. 4 is an isometric view of a thinned die 402 with added anchor structures 404A-D and support structures 406A-D, for implementing embodiments of the present disclosure. FIG. 5A is a top view of a thinned die 402 with added anchor structures 404A-D and support structures 406A-D, for implementing embodiments of the present disclosure. FIG. 5B is a sectional view of the thinned die 402 with added anchor structures 404A-D and support structures 406A-D, for implementing embodiments of the present disclosure. It should be noted that the anchor structures 404A-D and support structures 406A-D are not drawn to scale. It should also be noted that while the anchor structures 404A-D and support structures 406A-D are both shown in FIGS. 4, 5A and 5B, the thinned die 402 may include only one of either the anchor structures or the support structures in some implementations.

The anchor structures 404A-D and the support structures 406A-D add structural rigidity to the thinned die 402. The added structural rigidity compensates for the stresses induced by the variations in density of the conductive lines and conducting devices in the metallization layers used for interconnect structures or creating devices such as capacitors, inductors etc. The thinned die 402 has a total thickness of between about 30 um and about 200 um in one implementation.

The support structures 406A-D can be formed in an upper metallization layer M7 or any of the other metallization layers M1-7 or insulating layers of the interconnect structure. Each of the metallization layers M1-7 can have equal or different thicknesses. By way of example the metallization layers M1-7 can have corresponding thicknesses T1 and T7 of between about 6 nm and about 30 um. In one implementation the layers of the interconnect structure containing the support structures 406A-D can be thicker or thinner than intervening layers. The support structures 406A-D can have equal or different widths W1, W2. By way of example, the support structures 406A-D can have widths W1, W2 of between about 6 nm and about 40 nm.

The support structures 406A-D provide lateral support to substantially prevent the curving, bending stresses along the edges 422A-D, as discussed above in FIGS. 3B and 3C. The support structures 406A-D can extend substantially along the full length of the corresponding edges 422A-D of the thinned die 402.

The various vias 505 provide electrical connections between different metallization layers M1-M7 of the metal interconnect structure. The anchor structures 404A-D and the support structures 406A-D may or may not be used as electrical current or signal pathways or electrical devices such as capacitors or inductors or other electrical devices. In one implementation, the anchor structures 404A-D and the support structures 406A-D are formed in similar fashion as the vias 505 and other metallization interconnect structures.

The anchor structures 404A-D can have equal or different widths W4. Width W4 can be about 0 nm and about 40 nm. The anchor structures 404A-D provide support columns through the metallization interconnect structure to the thinned die 402. The support holds the layers 512, 514, 516 together. The anchor structures 404A-D also provide lateral, shearing support to the thinned die 402 to prevent lateral shearing between the layers 512, 514, 516.

The anchor structures 404A-D can include upper overhangs 410A-D in metallization layer M7 and lower overhangs in metallization layer M1 410A'-D'. The optional overhangs 410A-D and 410A'-D' can tie an upper metallization layer such as metallization layer M7 to a lower metallization layer such as metallization layer M1 so as to substantially prevent the intervening layers 516 from pulling apart due to delamination stresses. The optional overhangs 410A-D and 410A'-D' can have a width W3 of about 0 nm and about 40 nm.

It should be noted that while seven metallization layers M1-7 are shown, more of less than seven metallization layers can be included. One or more of the metallization layers M1-7 can be passivated. Similarly, insulator layers I1-8 can include more or less than eight insulator layers and can also include more than one layer between the metallization layers M1-7. The insulator layers I1-8 can be formed from any suitable material such as but not limited to: spin on glass, polysilicon, one or more oxides or ceramic materials and other materials.

Figure 6:
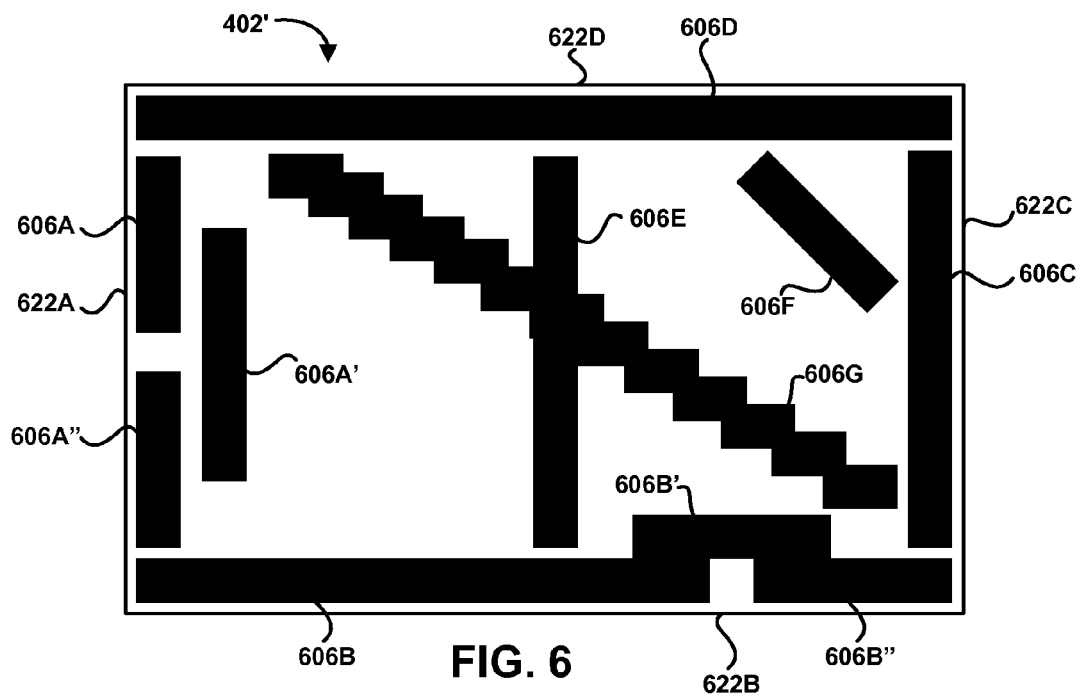
FIG. 6 is a top view of a thinned die with added support structures, for implementing embodiments of the present disclosure.

FIG. 6 is a top view of a thinned die 402' with added support structures 606A-D, for implementing embodiments of the present disclosure. The support structures 606A-D can extend along an entire length of a corresponding side 622A-D.

The support structures 606A-D can be in one or more segments. By way of example, support structures 606C-D extend substantially along an entire length of a corresponding side 622C-D. In contrast, the support structures 606A-B are segmented into portions 606A, 606A' and 606A" and 606B, 606B' and 606B", respectively. The segments of the support structures 606A-B can overlap lengthwise as shown by segments 606A-A" and 606 B-B". The segments 606A-A" and 606 B-B" can be the same width or different widths.

The segments can be offset as shown by segments 606A-A" or alternatively, the segments can be in contact with one another to form a staggered support structure as shown by segments 606 B-B". Alternatively, the segments may not overlap such as shown by segment 606A and 606A'.

An additional support structure 606E can be included in a substantially centralized portion of the thinned die 402'. The support structures can be formed in an angled orientation, such as shown by segment 606F, or a substantially diagonal, stepped, orientation, such as shown by support structure 606G, in the corresponding metallization layer of the thinned die 402'.

Figure 7:
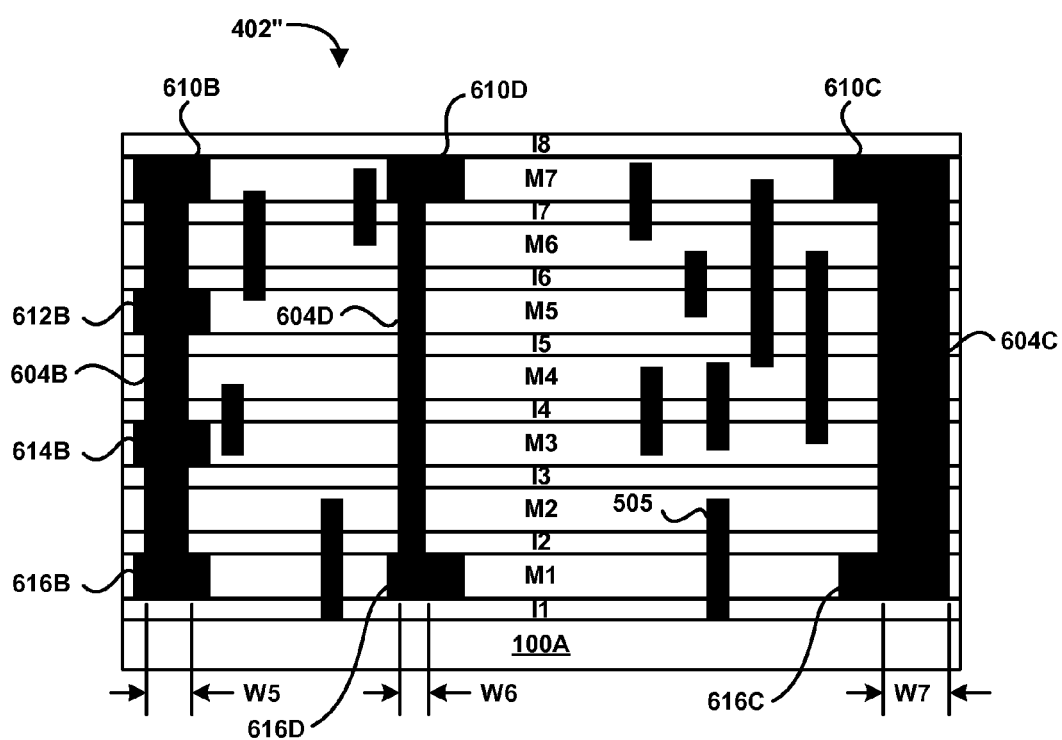
FIG. 7 is a sectional view of a thinned die with added anchor structures, for implementing embodiments of the present disclosure.

FIG. 7 is a sectional view of a thinned die 402" with added anchor structures 604B-C, for implementing embodiments of the present disclosure. The anchor structures 604B-C are similar to the corner anchor structures 404B-C described above. The anchor structures 604B-C can be equal or unequal widths. The anchor structures can optionally include more than two over hangs as shown by overhangs 610B-612B.

One or more additional anchor structures 604D can be included. The additional anchor structure 604D is similar to the anchor structures 604B-C, however, the additional anchor structure 604D can be included in a location other than a corner of the thinned die 402". By way of example, the additional anchor structures 604D can be in a substantially centralized portion of the thinned die 402". The additional anchor structure 604D can optionally include respective overhangs 610D, 616D.

The anchor structures 604A-B and additional anchor structure 604D can have equal or different widths W5-7. Widths W5-7 can be between about 6 nm and about 40 nm. The respective widths W1-7 and thicknesses T1-7 of the support structures 406A-D, 606A-G, anchor structures 404A-D, 604B-D and overhangs 410A-D, 410A'-D', 610B-D, 616B-D, are selected to provide a desired amount of strength to compensate for the respective stresses caused by variations in density of the conductive lines and conducting devices in the metallization layers.

The length, width, location and number of support structures and anchor structures are limited by the available area in the die 402, 402', 402". While more support structures and anchor structures would provide additional structural support to the thinned die 402, 402', 402" than fewer support structures and anchor structures would, however the support structures and anchor structures consume valuable area needed for forming electrical interconnects to the ever denser semiconductor devices in the thinned semiconductor wafer 100A. In one implementation, one or more metallization layers are added to provide the needed area for the support structures and anchor structures as compared to a die without the support structures and anchor structures.

Figure 8:
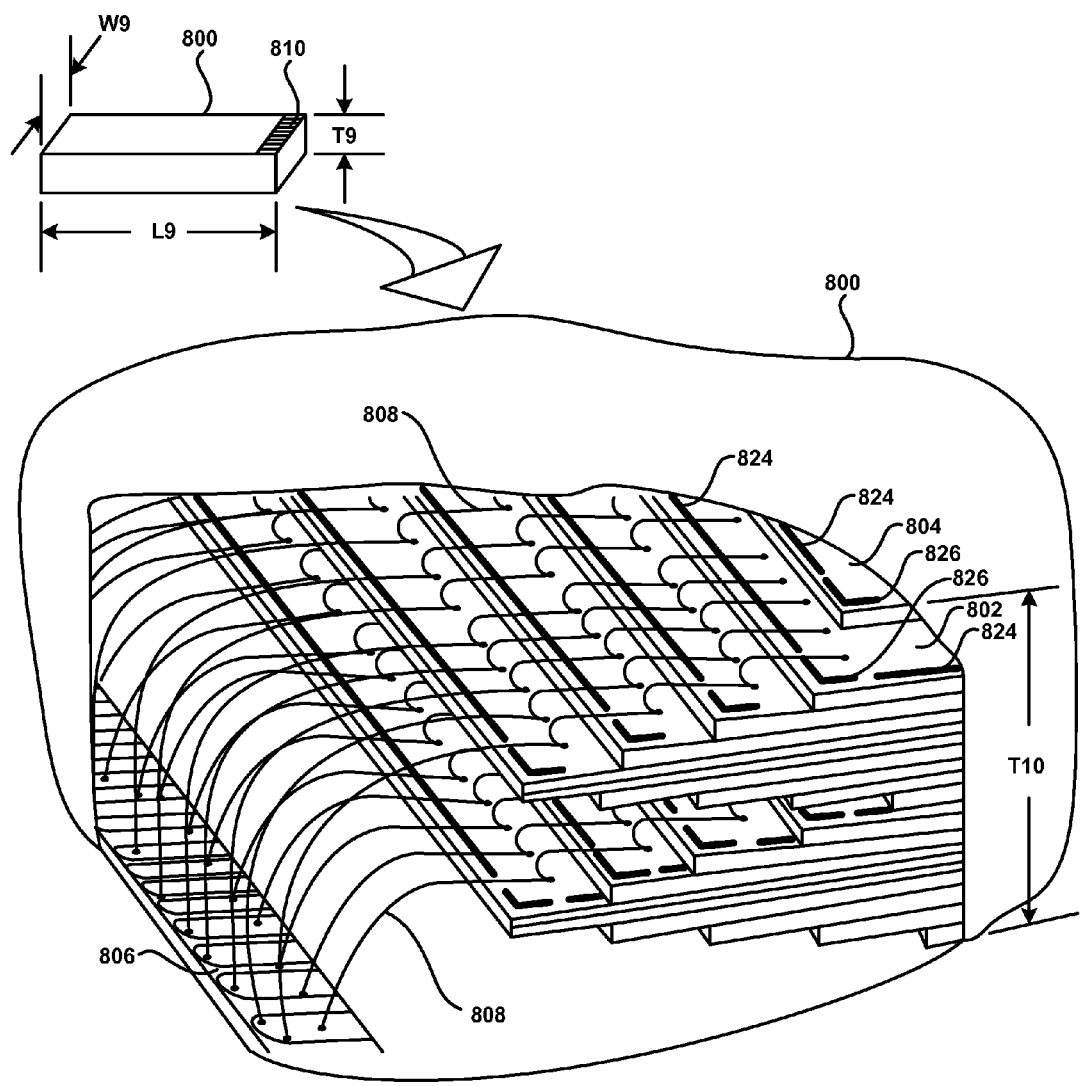
FIG. 8 is a cutaway view of multiple, thinned dies, stacked in a memory card package, for implementing embodiments of the present disclosure.

FIG. 8 is a cutaway view of multiple, thinned dies 802, stacked in a memory card package 800, for implementing embodiments of the present disclosure. The memory card package 800 can be a SD card, SD mini card, an SD micro card, a memory stick, or any other memory card package including multiple layers of memory and/or processor dies. The memory card package 800 includes a predefined form factor package having a predefined length L9, predefined width W9, predefined thickness T9 and predefined external contact structure 810. The multiple, thinned dies 802 can optionally, include at least one processor 804. Connect structures 808 couple the multiple, thinned dies 802 to a contact pad structure 806. The contact pad structure 806 is coupled to the predefined external contact structure 810 of the memory card package 800. The contact pad structure 806 of the memory card package 800.

The stacked, thinned dies 802 have a thickness T10 less than the predefined thickness T9 of the memory card package 800. By way of example, if the predefined thickness T9 of the memory card package 800 is 1 mm, then the thickness T10 will be less than 1.0 mm. The memory card package 800 can include as many stacked, thinned dies 802 that will fit within the predefined thickness T9 of the memory card package 800. Sixteen stacked, thinned dies 802 are shown but more or less than sixteen stacked, thinned dies 102A can be included in the memory card package 800.

The multiple, thinned dies 802 include support structures 824 and/or anchors 826. The processor 804 can also include support structures 824 and/or anchors 826. Each of the thinned dies 802 are shown with the support structures 824 and/or anchors 826, however, it should understood that only one or more of the thinned dies 802 may require the support structures 824 and/or anchors 826 needed to provide the support structure for the entire stack of the thinned dies 802.

Figure 9:
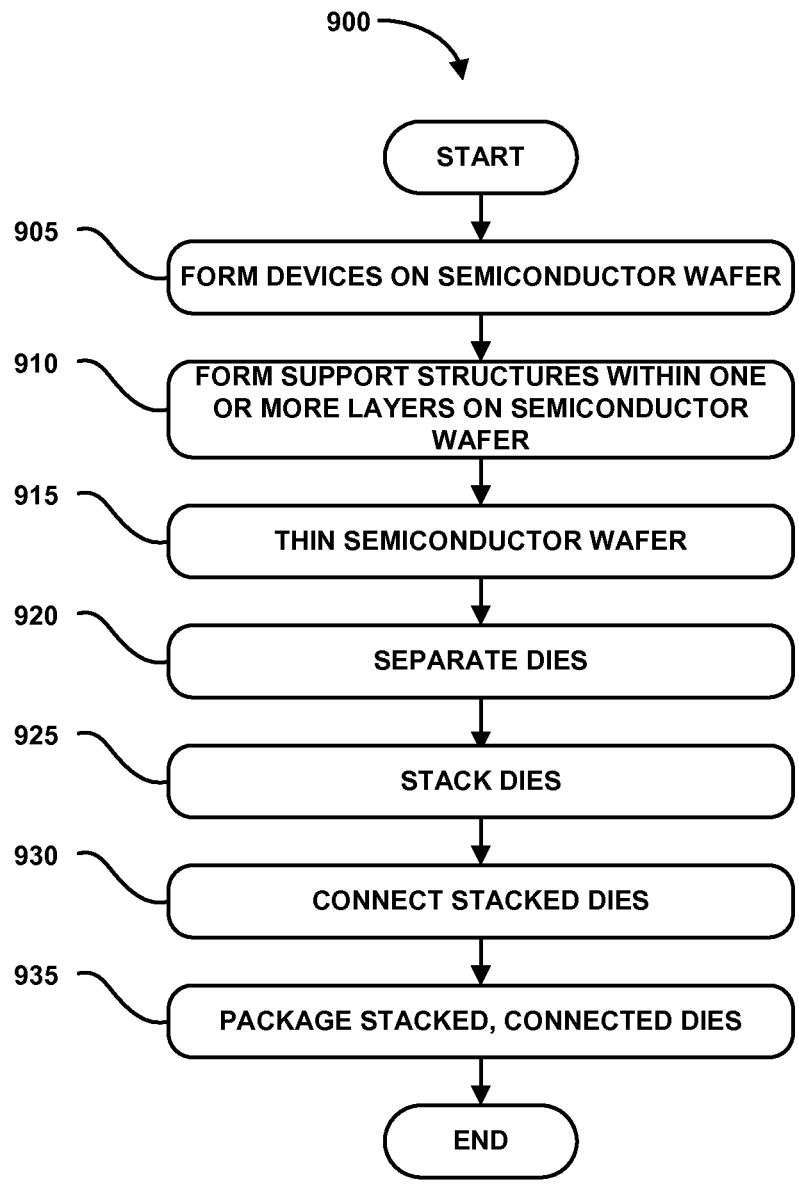
FIG. 9 is a flowchart diagram that illustrates the method operations performed in forming the memory card package, for implementing embodiments of the present disclosure.

FIG. 9 is a flowchart diagram that illustrates the method operations 900 performed in forming the memory card package 800, for implementing embodiments of the present disclosure. In an operation 905, the semiconductor devices are formed on the semiconductor wafer 100. The semiconductor devices can be formed in dies 102. Each of the dies can have one or more planes 202A-F of semiconductor devices. Each of the planes 202A-F can have different densities of the conductive lines and conducting devices in the metallization layers contained therein.

In an operation 910, support structures are formed within one or more layers formed on the surface of the semiconductor wafer 100. The support structures can include die localized support structures such as anchor structures 404A-D and the support structures 406A-D for each die 102A as described in FIG. 10 below.

In an operation 915, the semiconductor wafer 100 is thinned to produce a thinned semiconductor wafer 100A as described in more detail above. The resulting thinned semiconductor wafer 100A can have a thickness of between about 40 um and about 200 um, including the electrical interconnect structure.

In an operation 920, the thinned semiconductor wafer 100A is divided into multiple thinned dies 102A. The thinned dies 102A can be separated by a dicing or similar cutting operation.

In an operation 925, the separated, thinned dies 102A are stacked to fit in a selected form factor packaging. By way of example, the multiple thinned dies 102A are stacked to form a selected memory capacity for the selected form factor. Additional dies, such as a processor 220 die, can also be stacked with the multiple thinned dies 102A. An optional dielectric, heat dissipating layer can be placed between each of the multiple, stacked, thinned dies 102A.

In an operation 930, the multiple, stacked, thinned dies 102A and any additional dies, such as the processor die 220, are connected to the packaging of the selected form factor. By way of example, the multiple, stacked, thinned dies 102A and the processor 220 are coupled to the contact pad structure 806 of the selected form factor such as a memory card package or a solid state drive package. In an operation 935, the stacked, thinned, connected dies 102 are packaged in the selected form factor such as the memory card package 800 or other form factors. The method operations can then end.

It should be noted that while the memory dies are discussed as examples in the above detailed description, the thinned dies 102A can include any desired semiconductor structure such as memory devices, system on a chip, graphics processors, microprocessors, programmable logic arrays, application specific integrated circuits or any other semiconductor circuitry.

Figure 10:
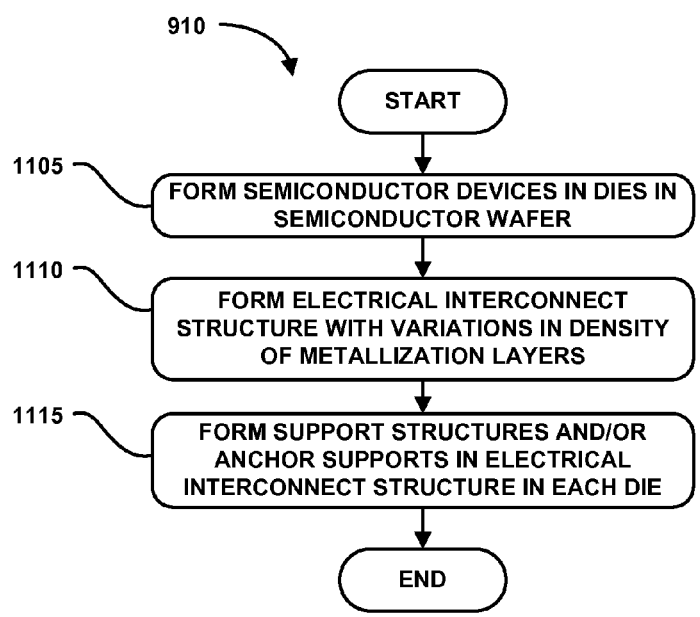
FIG. 10 is a flowchart diagram that illustrates an alternative or additional method operations performed in forming support structures on the semiconductor wafer, for implementing embodiments of the present disclosure.

FIG. 10 is a flowchart diagram that illustrates an alternative or additional method operations 910 performed in forming support structures on the semiconductor wafer 100, for implementing embodiments of the present disclosure. In an operation 1105, semiconductor devices are formed in the semiconductor wafer 100 in multiple dies 102.

In an operation 1110, the electrical interconnect structures are formed over the semiconductor devices. The electrical interconnect structures include variations in density of the conductive lines and conducting devices in the metallization layers. In an operation 1115, support structures such as anchor structures 404A-D and the support structures 406A-D are formed in the electrical interconnect structures and the method operations can continue in operation 915, as described in FIG. 9 above. The anchor structures 404A-D and the support structures 406A-D can be formed simultaneously with the formation of the electrical interconnect structures. Alternatively, at least a portion of the anchor structures 404A-D and the support structures 406A-D can be formed before or after the formation of the electrical interconnect structures.

Figure 11:
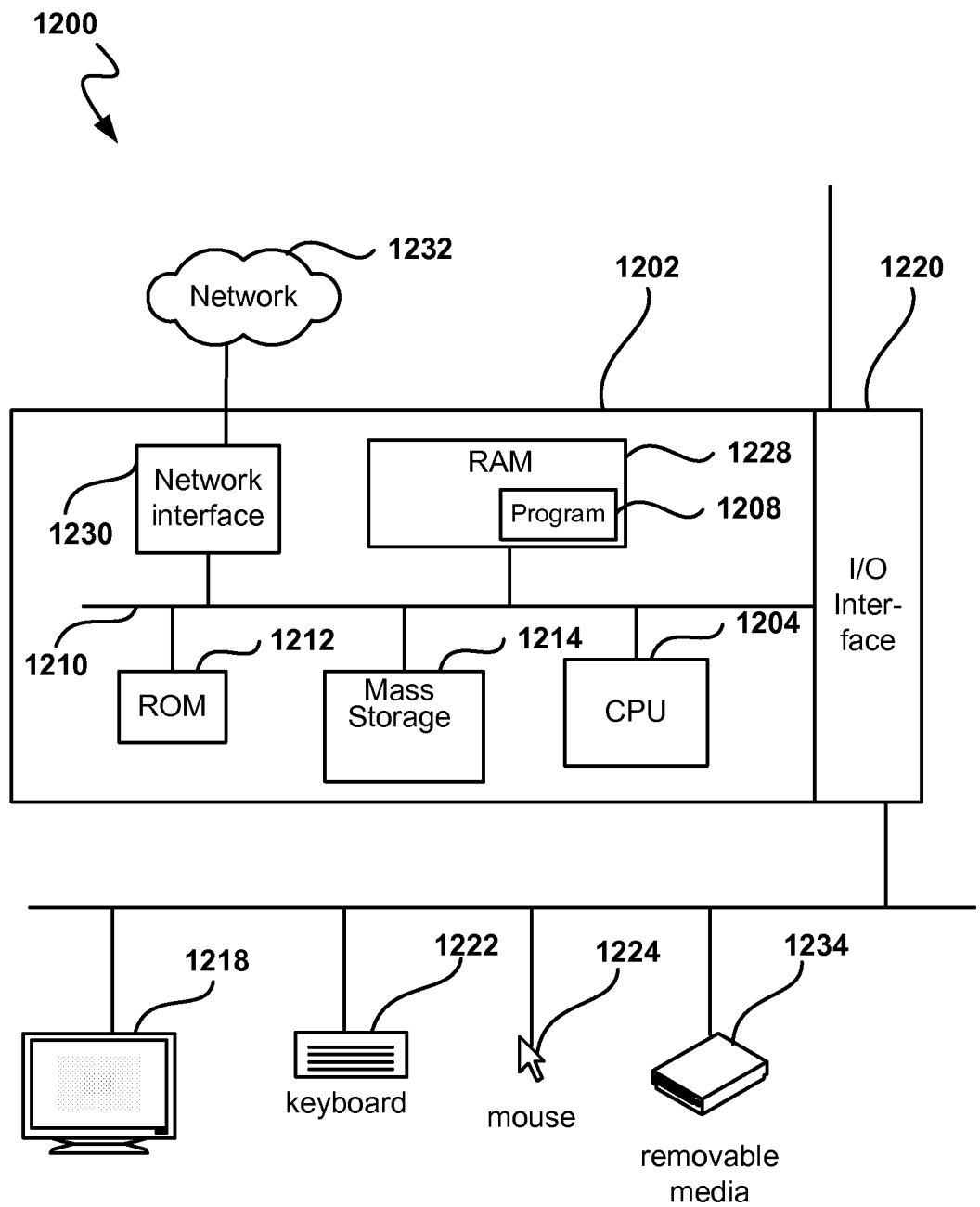
FIG. 11 is a block diagram of an example computer system, for implementing embodiments of the present disclosure.

FIG. 11 is a block diagram of an example computer system 1200, for implementing embodiments of the present disclosure. A general or specialized computer system, such as the computer system 1200 and used for executing the operations for performing at least a portion of the analyses described above. The computer system 1200 includes a computer 1202, a display 1218, an optional printer or output device (not shown), a removable media (e.g., magnetic/optical/flash) drive 1234, a mass storage system 1214 (e.g., hard disk drive, solid state drive, or other suitable data storage device), a network interface 1230, and a keyboard 1222. Additional user interface devices such as a mouse 1224, a touch pad or touch screen can also be included.

The computer 1202 includes a central processing unit 1204, one or more data buses 1210, random access memory (RAM) 1228, read only memory (ROM) 1212, and an input/output interface 1220. The computer 1202 can be a personal computer (such as an IBM compatible personal computer, a Macintosh computer or Macintosh compatible computer), a workstation computer (such as a Sun Microsystems or Hewlett-Packard workstation), or some other suitable type of computer.

The CPU 1204 can be a general purpose digital processor or a specially designed processor. The CPU 1204 controls the operation of the computer system 1200. Using instructions retrieved from memory (e.g. program(s) 1208), the CPU 1204 controls the reception and manipulation of input data and the output and display of data on output devices.

The data buses 1210 are used by the CPU 1204 to access the RAM 1228, the ROM 1212 and the mass storage 1214. The RAM 1228 is used by the CPU 1204 as a general storage area and as scratch-pad memory, and can also be used to store input data and processed data. The RAM 1228 and the ROM 1212 can be used to store computer readable instructions or program code 1208 readable and executable by the CPU 1204 as well as other data.

The bus 1210 can also be used to access the input, output, and storage devices used by the computer 1202. These devices include the display 1218, the optional printer (not shown), the removable media drive 1234, and the network interface 1230. The input/output interface 1220 is used to receive input from keyboard 1222 and send decoded symbols for each pressed key to CPU 1204 over the data bus 1210.

The display 1218 is an output device that displays images of data provided by the CPU 1204 via the bus 1210 or provided by other components in the computer system 1200. The optional printer device, when operating as a printer, provides an image on a sheet of paper or a similar surface. Other output devices such as a plotter, projector, etc. can be used in place of, or in addition to, the printer device.

The removable media drive 1234 and the mass storage 1214 can be used to store various types of data. The removable media drive 1234 facilitates transporting such data to other computer systems, and mass storage 1214 permits fast access to large amounts of stored data. The mass storage 1214 may be included within the computer system or may be external to the computer system such as network attached storage or cloud storage accessible over one or more networks (e.g., local area networks, wide area networks, wireless networks, Internet 1232) or combinations of such storage devices and locations.

The CPU 1204 together with an operating system operate to execute computer readable code and logic and produce and use data. The computer code, logic and data may reside within the RAM 1228, the ROM 1212, or the mass storage 1214 or other media storage devices and combinations thereof. The computer code and data could also reside on a removable program medium and loaded or installed onto the computer system 1200 when needed. Removable program media include, for example, DVD, CD-ROM, PC-CARD, floppy disk, flash memory, optical media and magnetic disk or tape.

The network interface 1230 is used to send and receive data over a network 1232 connected to other computer systems. An interface card or similar device and appropriate software implemented by the CPU 1204 can be used to connect the computer system 1200 to an existing network and transfer data according to standard protocols such as local area networks, wide area networks, wireless networks, Internet and any other suitable networks and network protocols.

The keyboard 1222 is used by a user to input commands and other instructions to the computer system 1200. Other types of user input devices can also be used in conjunction with the present invention. For example, pointing devices such as a computer mouse, a track ball, a stylus, touch pad, touch screen or a tablet can be used to manipulate a pointer on a screen of a general-purpose computer.

It will be further appreciated that the instructions represented by the operations in the above figures are not required to be performed in the order illustrated, and that all the processing represented by the operations may not be necessary to practice the invention. It should also be appreciated that some operations may have sub-operations and in other instances, certain operations described herein may not be included in the illustrated operations. Further, the processes described in any of the above figures can also be implemented in software stored in any one of or combinations of the RAM, the ROM, or the hard disk drive.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

One of skill in the art will recognize that this invention is not limited to the two dimensional and three dimensional exemplary structures described but cover all relevant memory structures within the spirit and scope of the invention as described herein and as understood by one of skill in the art.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A semiconductor die comprising:
a plurality of semiconductor devices formed in a portion of a semiconductor wafer;
an electrical interconnect structure formed over the plurality of semiconductor devices and providing electrical connections to the plurality of semiconductor devices, the electrical interconnect structure defined from a plurality of metallization layers, each of the metallization layers including conductive lines, wherein at least one portion of at least one of the plurality of metallization layers includes a density of the conductive lines that varies as compared to the other portions of the metallization layers; and
at least one support structure formed in the electrical interconnect structure to provide lateral support to substantially prevent at least one of a curving stress or a bending stress in the portion of the semiconductor wafer;
wherein the at least one support structure is formed in at least two layers of the electrical interconnect structure and at least one anchor structure is formed through any intervening layers between the at least two layers to connect the portions of the at least one support structure in each of the at least two layers.

2. The semiconductor die of claim 1, wherein the portion of the semiconductor wafer is a thinned semiconductor wafer having a thickness of between about 40 um and about 200 um.

3. The semiconductor die of claim 2, wherein the thinned semiconductor wafer is thinned after the plurality of semiconductor devices are formed in the portion of the semiconductor wafer.

4. The semiconductor die of claim 1, wherein the at least one support structure is formed in a single layer of the electrical interconnect structure.

5. The semiconductor die of claim 1, wherein the at least one support structure has different respective widths in each of the at least two layers.

6. The semiconductor die of claim 1, wherein the at least one support structure is formed in a metal used to form a plurality of electrical interconnects in the electrical interconnect structure.

7. The semiconductor die of claim 1, wherein the at least one support structure is formed of a conductive metal used to form a plurality of electrical interconnects in the electrical interconnect structure and wherein the least one support structure is not a portion of one of the plurality of electrical interconnects.

8. The semiconductor die of claim 1, wherein the at least one support structure is formed of a conductive metal used to form a plurality of electrical interconnects in the electrical interconnect structure and wherein the least one support structure forms a portion of one of the plurality of electrical interconnects.

9. The semiconductor die of claim 1, wherein the at least one support structure is formed of a conductive metal used to form a plurality of electrical interconnects in the electrical interconnect structure and wherein the least one support structure forms at least a portion of an electrical device in the electrical interconnect structure.

10. The semiconductor die of claim 1, wherein the at least one support structure is a portion of a wafer support structure, wherein the wafer support structure extends across more than one semiconductor die.

11. The semiconductor die of claim 1, wherein the semiconductor die is one of a plurality of stacked semiconductor dies in a predefined form factor package, the form factor package including a plurality of connect structures coupling the plurality of stacked semiconductor dies to a contact pad structure.

12. The semiconductor die of claim 1, wherein the plurality of semiconductor devices include memory cells.

13. The semiconductor die of claim 1, wherein the plurality of semiconductor devices include 3D memory cells.

14. The semiconductor die of claim 1, wherein the plurality of semiconductor devices form a processor.

15. A semiconductor die comprising:
a plurality of semiconductor devices formed in a portion of a semiconductor wafer;
an electrical interconnect structure formed over the plurality of semiconductor devices and providing electrical connections to the plurality of semiconductor devices, the electrical interconnect structure defined from a plurality of metallization layers, each of the metallization layers including conductive lines, wherein at least one portion of at least one of the plurality of metallization layers includes a density of the conductive lines that varies as compared to the other portions of the metallization layers;
a first support structure formed in a first one of the metallization layers, the first support structure having a first width;
a second support structure formed in a second one of the metallization layers, the second support structure having a second width different than the first width; and
an anchor structure formed through any layers intervening between the first metallization layer and the second metallization layer, wherein the first support structure, the second support structure and the anchor structure provide lateral support to substantially prevent at least one of a curving stress or a bending stress in the portion of the semiconductor wafer.

16. The semiconductor die of claim 15, wherein the at least one support structure is formed of a conductive metal used to form a plurality of electrical interconnects in the electrical interconnect structure and wherein the least one support structure is not a portion of one of the plurality of electrical interconnects.

17. The semiconductor die of claim 15, wherein the at least one support structure is formed of a conductive metal used to form a plurality of electrical interconnects in the electrical interconnect structure and wherein the least one support structure forms a portion of one of the plurality of electrical interconnects.

18. The semiconductor die of claim 15, wherein the first support structure has a first length corresponding to a length of the semiconductor die.

* * * * *